United States Patent
Divakaruni et al.

(10) Patent No.: US 9,418,903 B2
(45) Date of Patent: Aug. 16, 2016

(54) STRUCTURE AND METHOD FOR EFFECTIVE DEVICE WIDTH ADJUSTMENT IN FINFET DEVICES USING GATE WORKFUNCTION SHIFT

(71) Applicant: GLOBALFOUNDRIES Inc., Grand Cayman (KY)

(72) Inventors: Ramachandra Divakaruni, Ossining, NY (US); Arvind Kumar, Chappaqua, NY (US); Carl Radens, LaGrangeville, NY (US)

(73) Assignee: Globalfoundries Inc. (KY)

( * ) Notice: Subject to any disclaimer, the term of this patent is extended or adjusted under 35 U.S.C. 154(b) by 20 days.

(21) Appl. No.: 14/283,633

(22) Filed: May 21, 2014

(65) Prior Publication Data

US 2015/0340294 A1    Nov. 26, 2015

(51) Int. Cl.
| | |
|---|---|
| H01L 21/00 | (2006.01) |
| H01L 21/84 | (2006.01) |
| H01L 27/12 | (2006.01) |
| H01L 21/308 | (2006.01) |
| H01L 29/66 | (2006.01) |

(52) U.S. Cl.
CPC .......... *H01L 21/845* (2013.01); *H01L 21/308* (2013.01); *H01L 27/1211* (2013.01); *H01L 29/66818* (2013.01)

(58) Field of Classification Search
CPC .............. H01L 27/10852; H01L 27/10817; H01L 21/817; H01L 29/66757; H01L 21/84
USPC ................................. 438/164, 254
See application file for complete search history.

(56) References Cited

U.S. PATENT DOCUMENTS

| | | | |
|---|---|---|---|
| 7,534,669 B2 | 5/2009 | Anderson et al. | |
| 7,560,785 B2 | 7/2009 | Yu et al. | |
| 7,611,936 B2 * | 11/2009 | Mathew | H01L 21/32139 257/E21.19 |
| 7,902,035 B2 | 3/2011 | Yu et al. | |
| 8,106,459 B2 | 1/2012 | Chang et al. | |
| 8,354,320 B1 | 1/2013 | Xie et al. | |
| 8,415,216 B2 | 4/2013 | Anderson et al. | |
| 8,460,984 B2 | 6/2013 | Wahl et al. | |
| 8,828,818 B1 * | 9/2014 | Rodder | H01L 29/66795 257/E21.182 |
| 2004/0113171 A1 * | 6/2004 | Chiu et al. | 257/119 |
| 2005/0199919 A1 * | 9/2005 | Liu et al. | 257/288 |
| 2007/0090416 A1 * | 4/2007 | Doyle | H01L 21/823807 257/288 |
| 2007/0132009 A1 * | 6/2007 | Takeuchi | H01L 21/845 257/321 |

(Continued)

FOREIGN PATENT DOCUMENTS

CN    100466229 C    3/2009

*Primary Examiner* — Thao X Le
*Assistant Examiner* — Eric Jones
(74) *Attorney, Agent, or Firm* — Heslin Rothenberg Farley & Mesiti P.C.; George Blasiak

(57) ABSTRACT

Embodiments of the present invention provide methods and structures by which the inherent discretization of effective width can be relaxed through introduction of a fractional effective device width, thereby allowing greater flexibility for design applications, such as SRAM design optimization. A portion of some fins are clad with a capping layer or workfunction material to change the threshold voltage (Vt) for a part of the fin, rendering that part of the fin electrically inactive, which changes the effective device width (Weff). Other fins are unclad, and provide maximum area of constant threshold voltage. In this way, the effective device width of some devices is reduced. Therefore, the effective device width is controllable by controlling the level of cladding of the fin.

20 Claims, 8 Drawing Sheets

(56) References Cited

U.S. PATENT DOCUMENTS

| | | | |
|---|---|---|---|
| 2007/0231997 A1* | 10/2007 | Doyle et al. | 438/253 |
| 2008/0029821 A1* | 2/2008 | Yamagami | H01L 21/823807 257/365 |
| 2008/0128797 A1 | 6/2008 | Dyer et al. | |
| 2008/0283910 A1* | 11/2008 | Dreeskornfeld et al. | 257/332 |
| 2009/0057780 A1 | 3/2009 | Wong et al. | |
| 2009/0121288 A1* | 5/2009 | Patruno | 257/347 |
| 2009/0278196 A1 | 11/2009 | Chang et al. | |
| 2010/0065918 A1* | 3/2010 | Ikeno | H01L 21/823828 257/369 |
| 2010/0163971 A1 | 7/2010 | Hung et al. | |
| 2010/0252816 A1* | 10/2010 | Ko | H01L 29/66818 257/24 |
| 2011/0037129 A1 | 2/2011 | Yu et al. | |
| 2011/0115027 A1* | 5/2011 | Jagannathan et al. | 257/369 |
| 2011/0147848 A1 | 6/2011 | Kuhn et al. | |
| 2011/0263115 A1* | 10/2011 | Ganguli et al. | 438/595 |
| 2012/0025316 A1 | 2/2012 | Schultz | |
| 2012/0086053 A1* | 4/2012 | Tseng et al. | 257/288 |
| 2012/0299110 A1 | 11/2012 | Hung et al. | |
| 2013/0082329 A1 | 4/2013 | Chen et al. | |
| 2013/0149826 A1 | 6/2013 | Lee et al. | |
| 2013/0154016 A1* | 6/2013 | Glass et al. | 257/368 |
| 2014/0252469 A1* | 9/2014 | Lee | H01L 29/66431 257/337 |
| 2014/0361375 A1* | 12/2014 | Deniz | 257/369 |

* cited by examiner

STRUCTURE AND METHOD FOR EFFECTIVE DEVICE WIDTH ADJUSTMENT IN FINFET DEVICES USING GATE WORKFUNCTION SHIFT

FIELD OF THE INVENTION

The present invention relates generally to semiconductor fabrication, and more particularly, to structures and methods for adjusting the effective device width in finFET devices using gate workfunction shift.

BACKGROUND OF THE INVENTION

The semiconductor industry is rapidly transitioning from planar field effect transistors to fin type field effect transistors (finFETs), partially due to their density advantage such that the device's effective current-carrying width typically exceeds that of its footprint on the wafer. Inherent to FinFET device design is discretization of this effective width to multiples of twice the fin height (plus the fin thickness, in the case of a tri-gate). The constraint of discretized effective widths means that designers have more constraints in tuning device widths for optimal designs. For example, SRAM cell noise margin optimization frequently requires fine tuning of device width ratios. Various techniques have been attempted for modifying the effective device width of finFET devices. These include changing the physical fin height, and control of epitaxial growth. However, each of these approaches has disadvantages, such as increased fabrication complexity. It is therefore desirable to have improvements in finFET structures and methods of fabrication to address the aforementioned design constraints while avoiding the disadvantages of current techniques.

SUMMARY OF THE INVENTION

Embodiments of the present invention provide methods and structures by which the inherent discretization of effective width can be relaxed through introduction of a fractional effective device width, thereby allowing greater flexibility for SRAM design optimization. A portion of some fins are clad with a capping layer or workfunction material while other fins are unclad, and provide maximum area of constant threshold voltage. In this way, the effective device width of some devices is reduced. Therefore, the effective device width is modulated by controlling the level of cladding of the fin. Embodiments of the present invention utilize modulation of a workfunction material or capping layer to modulate the threshold voltage, and hence, control the effective device width of a finFET device.

In a first aspect, embodiments of the present invention provide a method of forming a semiconductor structure, comprising: forming a first fin and a second fin on an insulator layer, wherein the insulator layer is disposed on a semiconductor substrate; forming a mask region over the first fin; depositing a sacrificial layer adjacent to the second fin; forming a plurality of spacers adjacent to the second fin and in contact with the sacrificial layer; etching a lower portion of the second fin to form a recessed area; depositing a threshold voltage adjusting material in the recessed area, thereby modulating effective device width; removing the plurality of spacers and mask region; and forming a gate, the gate disposed over the first fin and the second fin.

In a second aspect, embodiments of the present invention provide a method of forming a semiconductor structure, comprising: forming a first fin and a second fin on an insulator layer, wherein the insulator layer is disposed on a semiconductor substrate; forming a mask region over the first fin; depositing a sacrificial layer adjacent to the second fin; etching an upper portion of the second fin to form a recessed area; depositing a threshold voltage adjusting material in the recessed area, thereby modulating effective device width; removing the mask region; and forming a gate, the gate disposed over the first fin and the second fin.

In a third aspect, embodiments of the present invention provide a semiconductor structure comprising: a semiconductor substrate; an insulator layer disposed on the semiconductor substrate; a first semiconductor fin disposed on the insulator layer; a second semiconductor fin disposed on the insulator layer; wherein the first semiconductor fin has a first effective height and the second semiconductor fin has a second effective height, and wherein the first effective height is greater than the second effective height; and a threshold voltage adjusting material disposed on a portion of the second semiconductor fin.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Figure 1:
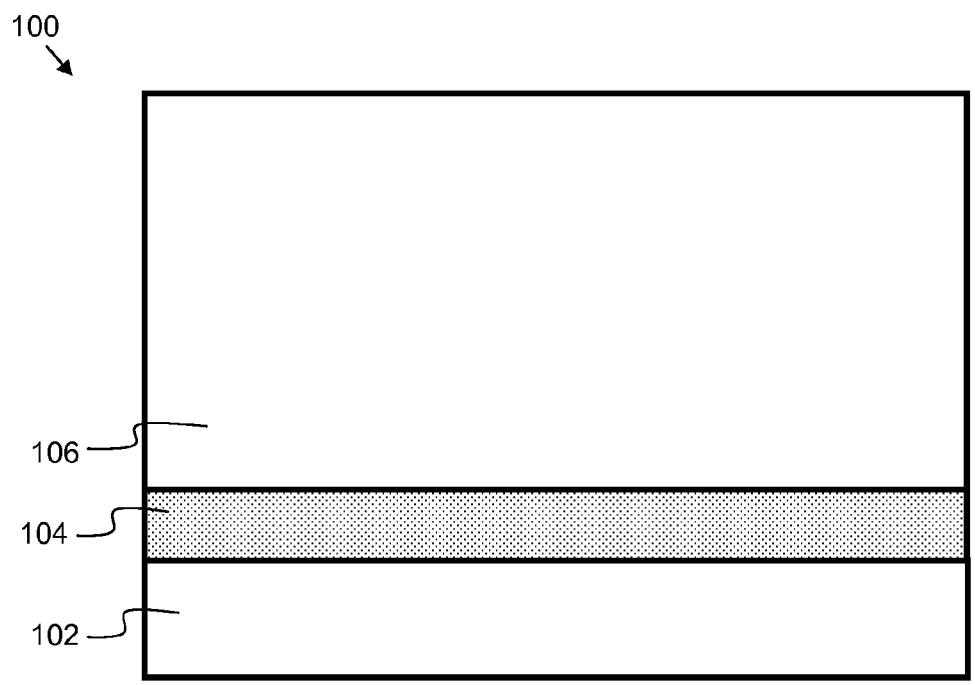

Often, similar elements may be referred to by similar numbers in various figures (FIGs) of the drawing, in which case typically the last two significant digits may be the same, the most significant digit being the number of the drawing figure (FIG). Furthermore, for clarity, some reference numbers may be omitted in certain drawings.

FIG. 1 is a semiconductor structure at a starting point for embodiments of the present invention.

Figure 2:
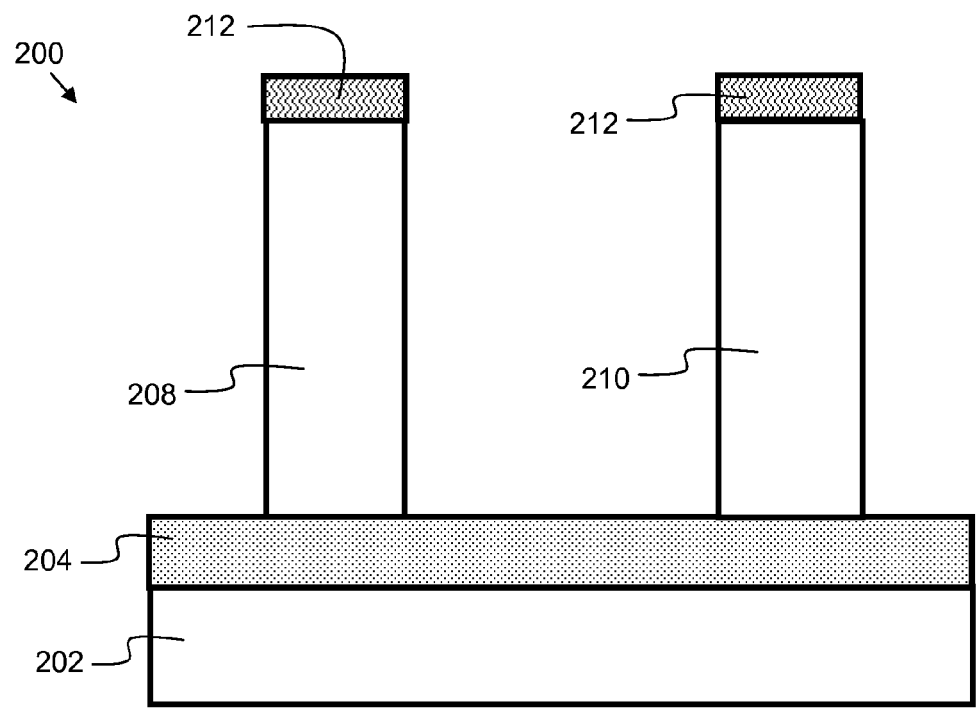

FIG. 2 is a semiconductor structure after a subsequent process step of fin formation.

Figure 3:
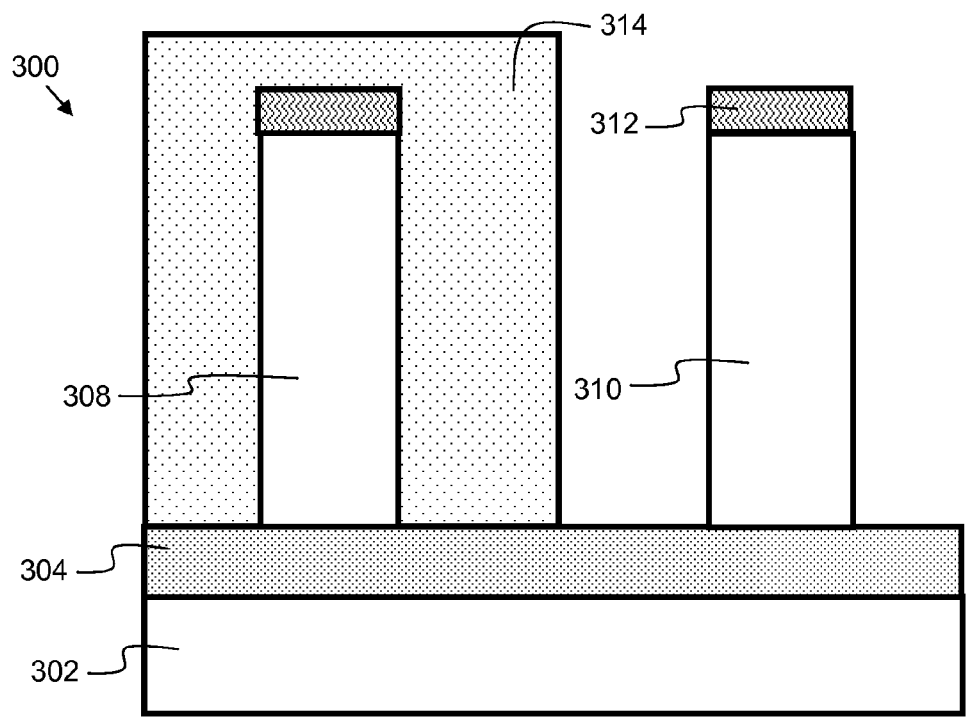

FIG. 3 is a semiconductor structure after a subsequent process step of forming a mask region over the first fin.

Figure 4:
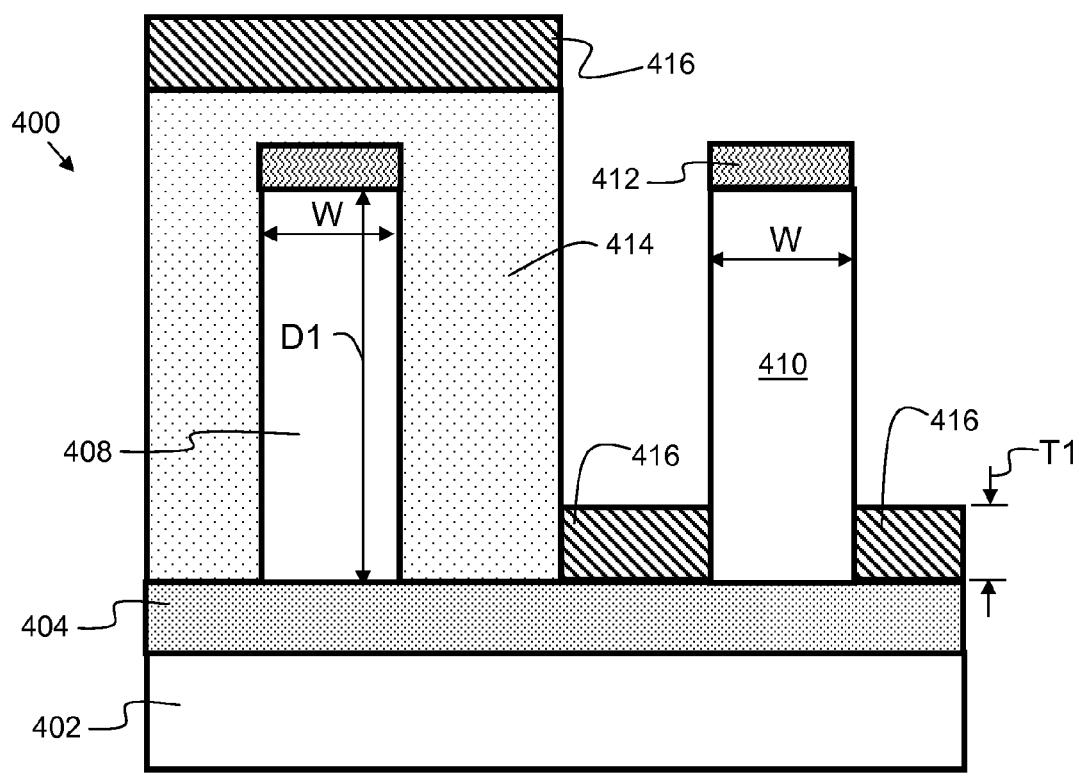

FIG. 4 is a semiconductor structure after a subsequent process step of depositing a sacrificial layer.

Figure 5:
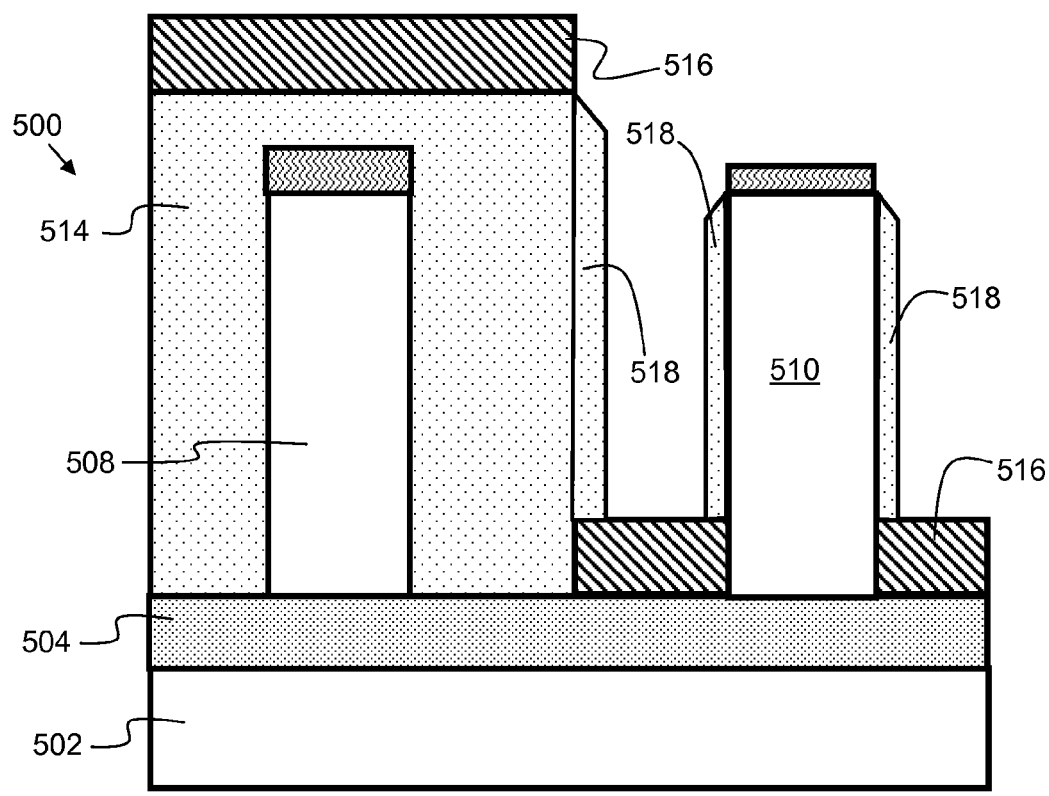

FIG. 5 is a semiconductor structure after a subsequent process step of spacer formation.

Figure 6:
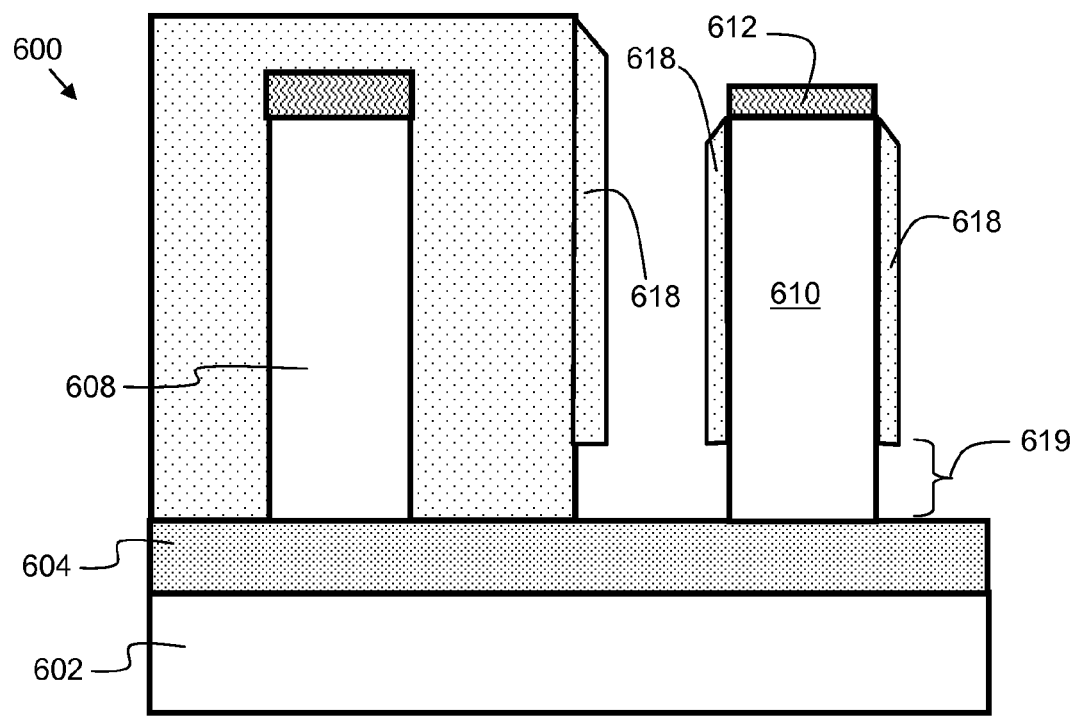

FIG. 6 is a semiconductor structure after a subsequent process step of removal of the sacrificial layer.

Figure 7:
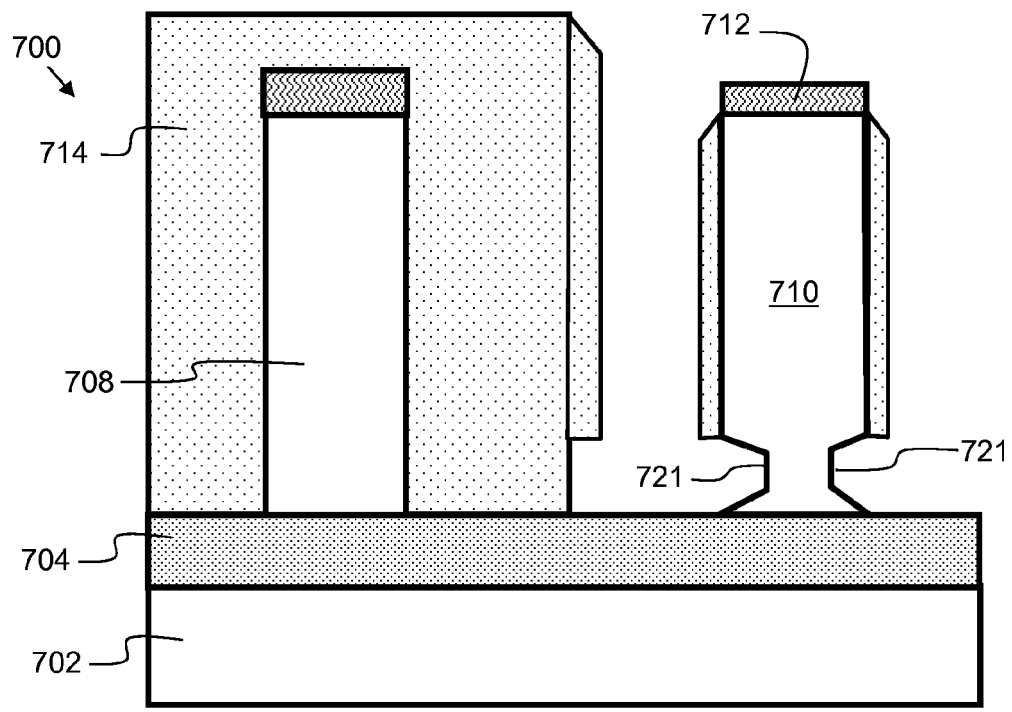

FIG. 7 is a semiconductor structure after a subsequent process step of etching a lower portion of the second fin to form a recessed area.

Figure 8:
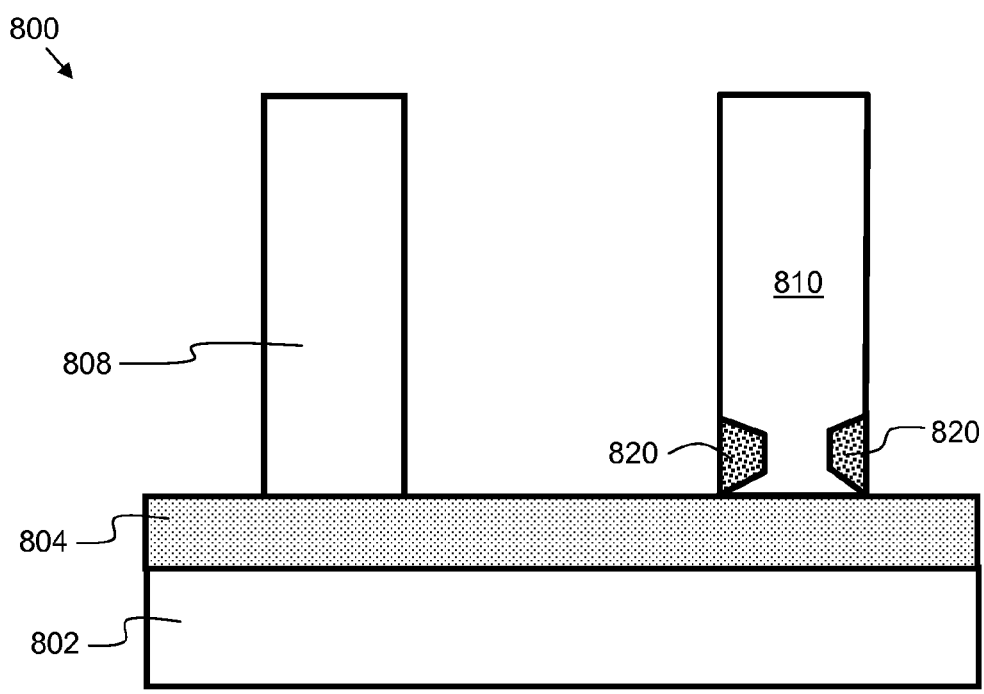

FIG. 8 is a semiconductor structure after a subsequent process step of depositing a workfunction material in the recessed area.

Figure 9:
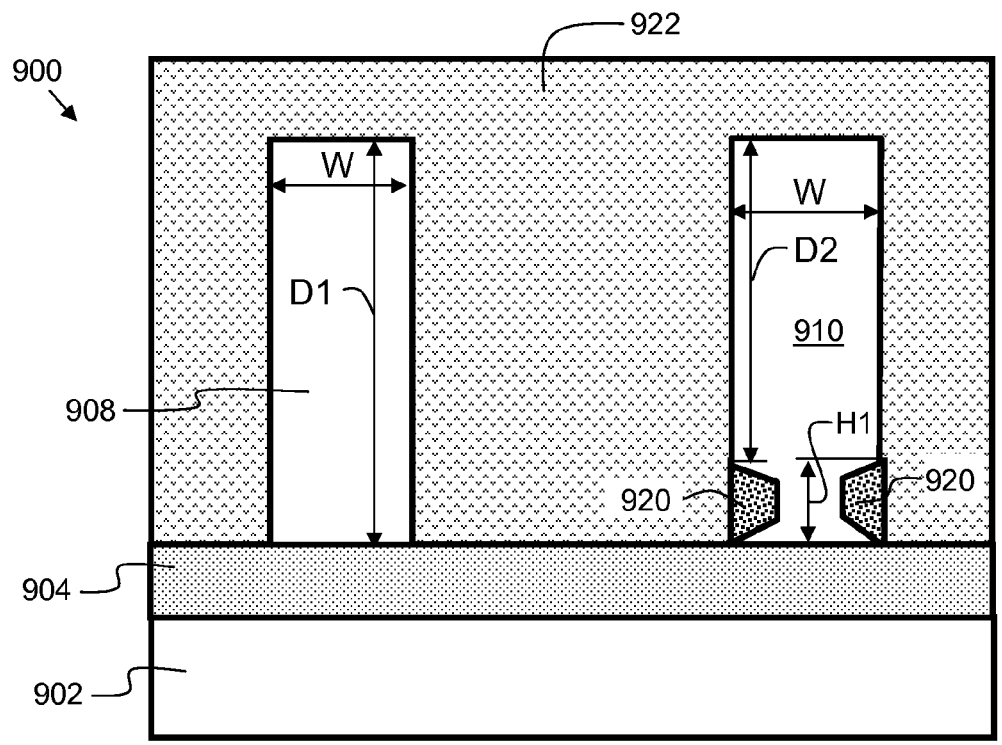

FIG. 9 is a semiconductor structure after a subsequent process step of gate formation.

Figure 10:
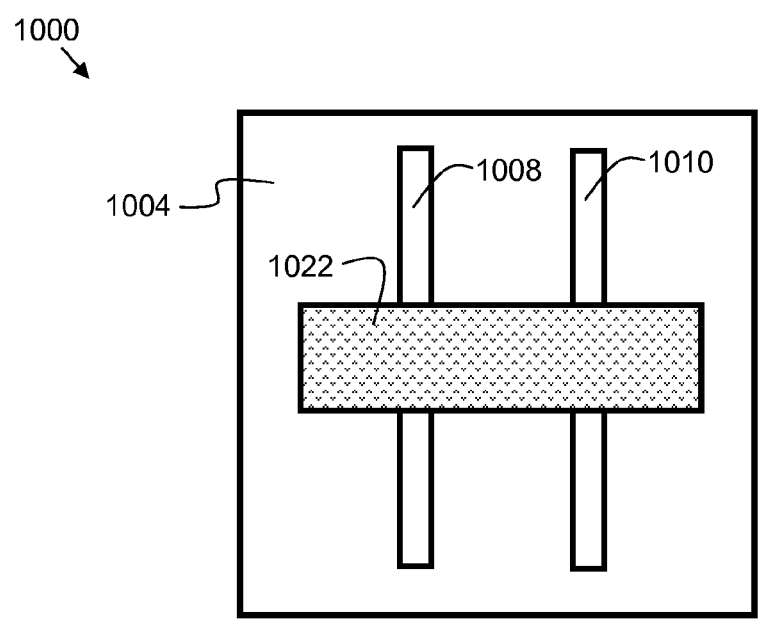

FIG. 10 is a top-down view of a semiconductor structure in accordance with embodiments of the present invention.

Figure 11:
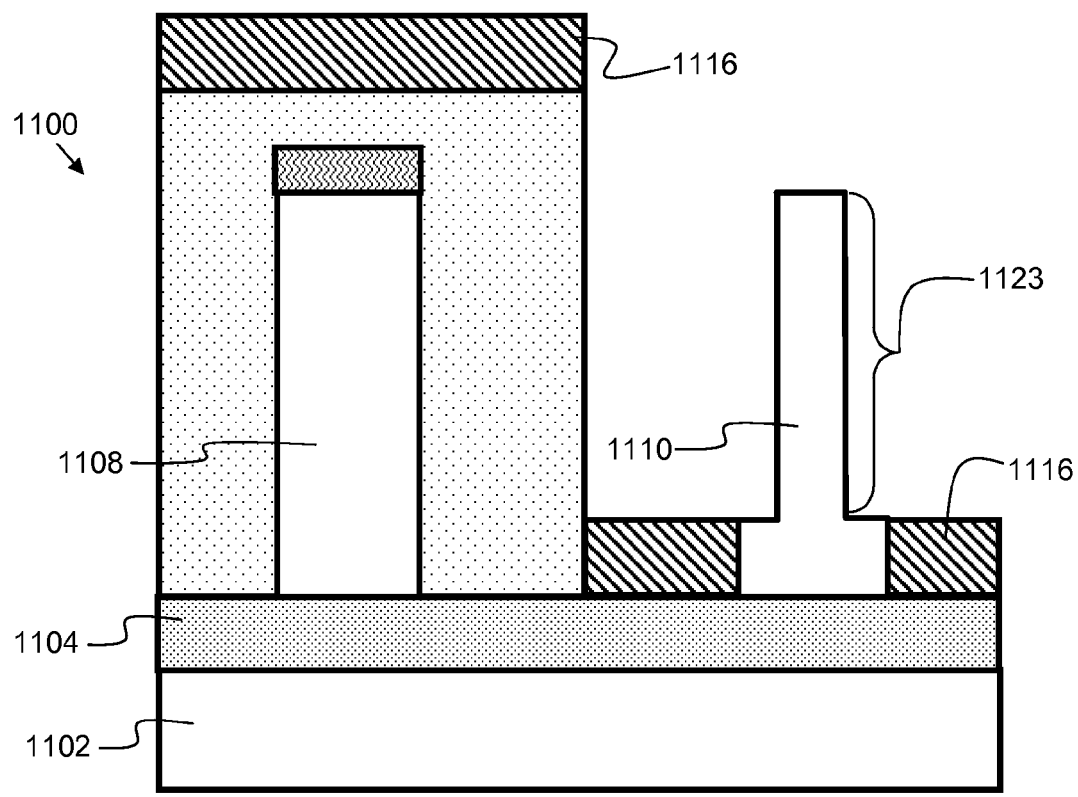

FIG. 11 is a semiconductor structure after a subsequent process step of etching a lower portion of the second fin to form a recessed area, in accordance with an alternative embodiment of the present invention.

Figure 12:
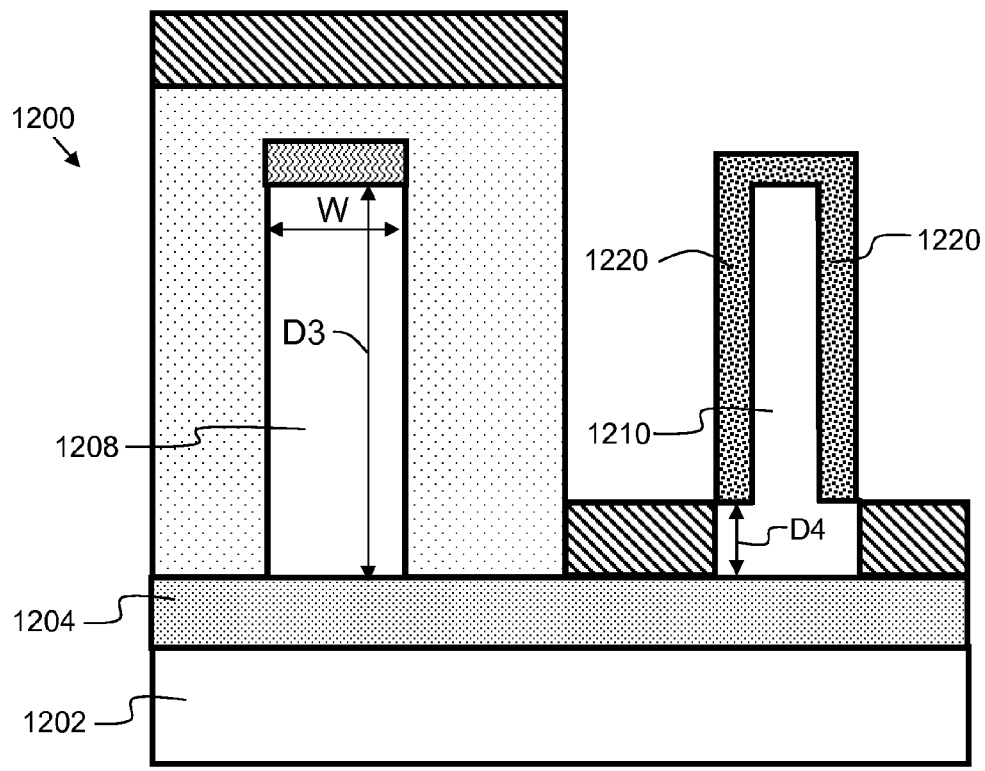

FIG. 12 is a semiconductor structure after a subsequent process step of depositing a workfunction material in the recessed area.

Figure 13:
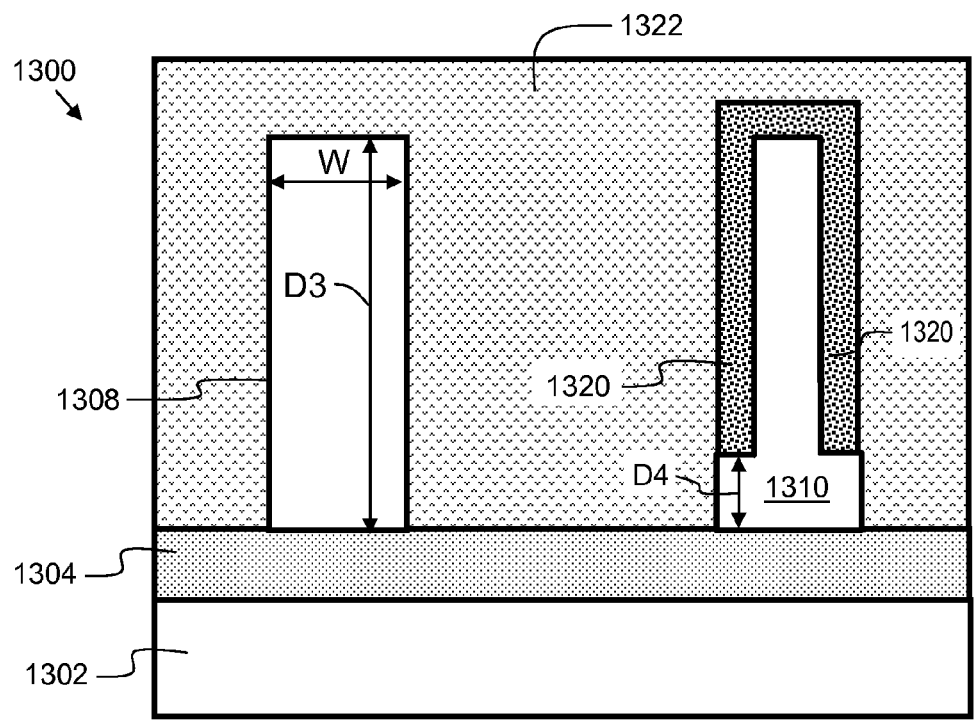

FIG. 13 is a semiconductor structure after a subsequent process step of gate formation.

Figure 14:
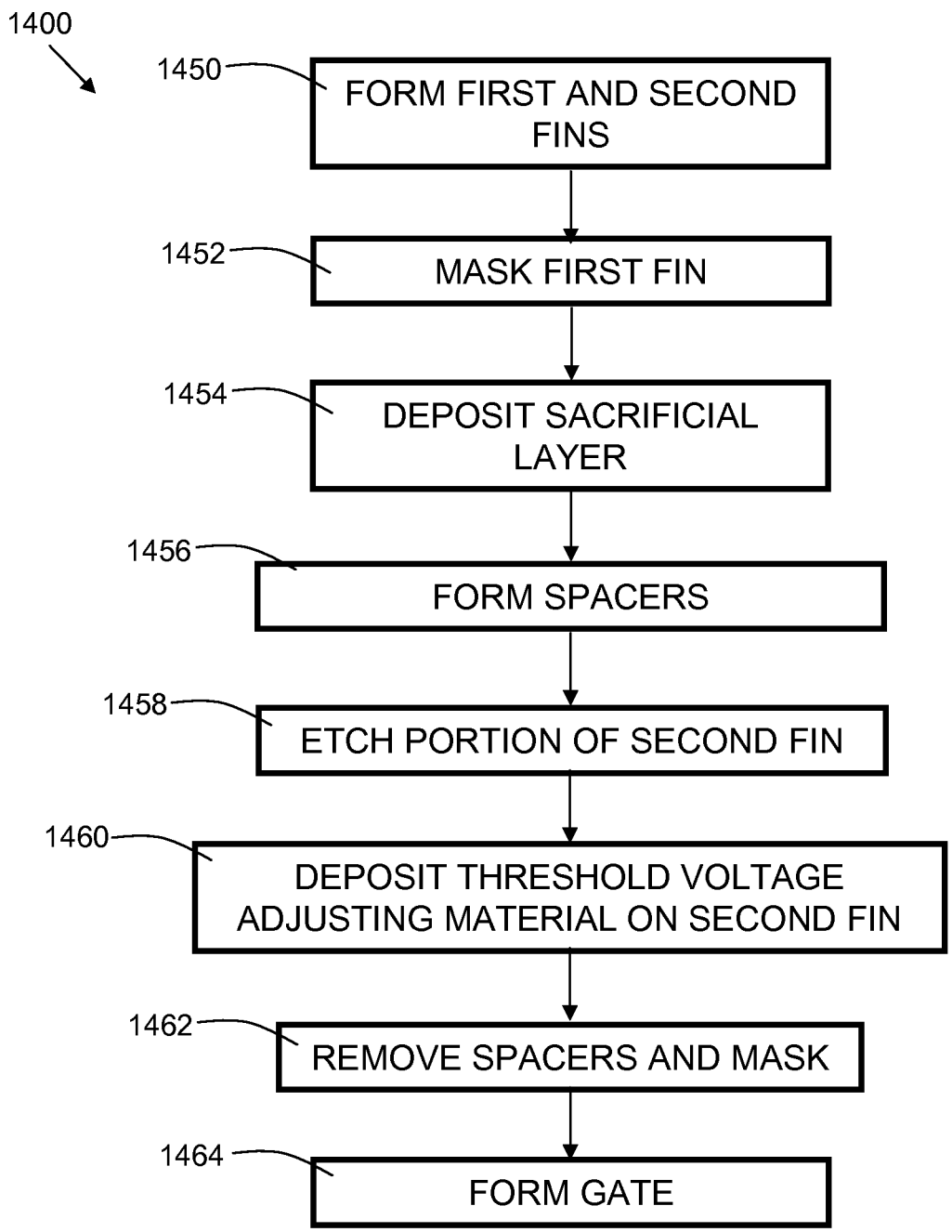

FIG. 14 is a flowchart indicating process steps for embodiments of the present invention.

DETAILED DESCRIPTION

Embodiments of the present invention provide methods and structures by which the inherent discretization of effective width can be relaxed through introduction of a fractional effective device width, thereby allowing greater flexibility for SRAM design optimization. A portion of some fins are clad with a capping layer or workfunction material to change the threshold voltage (Vt) for a part of the fin, rendering that part of the fin electrically inactive, which changes the effective device width (Weff). Other fins are unclad, and provide maximum area of constant threshold voltage. In this way, the effective device width of some devices is reduced. Therefore, the effective device width is modulated by controlling the level of cladding of the fin. Embodiments of the present invention utilize modulation of a workfunction material or capping layer to modulate the threshold voltage, and hence, control the effective device width of a finFET device.

FIG. 1 is a semiconductor structure 100 at a starting point for embodiments of the present invention. A bulk semiconductor substrate 102 forms the base of semiconductor structure 100. Bulk substrate 102 may be made from any of several known semiconductor materials such as, for example, silicon, germanium, a silicon-germanium alloy, a silicon carbon alloy, a silicon-germanium-carbon alloy, gallium arsenide, indium arsenide, indium phosphide, III-V compound semiconductor materials, II-VI compound semiconductor materials, organic semiconductor materials, and other compound semiconductor materials. An insulator layer 104 is disposed on the semiconductor substrate 102. In embodiments, insulator layer 104 may be comprised of silicon oxide, and may be referred to as a buried oxide (BOX) layer. A semiconductor-on-insulator (SOI) layer 106 is disposed on the insulator layer 104. In embodiments, the SOI layer 106 may be comprised of silicon or silicon germanium (SiGe).

FIG. 2 is a semiconductor structure 200 after a subsequent process step of fin formation. As stated previously, similar elements may be referred to by similar numbers in various figures (FIGs) of the drawing, in which case typically the last two significant digits may be the same. For example, bulk substrate 202 of FIG. 2 is similar to bulk substrate 102 of FIG. 1. Prior to fin formation, a hardmask layer 212 may be deposited over the SOI layer to protect the fins during downstream processing. The fins 208 and 210 may be formed using a sidewall image transfer (SIT) technique or other suitable method. In embodiments, the hardmask layer 212 may be comprised of silicon nitride, silicon oxide, silicon oxynitride, silicon oxycarbide (SiOC), or other suitable material. The material used for the hardmask layer 212 may be chosen for etch selectivity based on other materials used in the process flow.

FIG. 3 is a semiconductor structure 300 after a subsequent process step of forming a mask region 314 over the first fin 308. In embodiments, the mask region 314 is formed by depositing a layer of silicon oxide, followed by patterning and etching to remove the silicon oxide from the second fin 310.

FIG. 4 is a semiconductor structure 400 after a subsequent process step of depositing a sacrificial layer 416. In embodiments, the sacrificial layer 416 may be comprised of silicon nitride, silicon oxynitride, silicon oxycarbide (SiOC), or other suitable material. The material used for the sacrificial layer 416 may be chosen for etch selectivity based on other materials used in the process flow. The sacrificial layer 416 is deposited with a thickness T1. In embodiments, the thickness T1 may range from about 0.1 to about 0.5 of total fin height D1. Both fins 408 and 410 have a width W.

FIG. 5 is a semiconductor structure 500 after a subsequent process step of spacer formation. Spacers 518 are formed adjacent to the second fin 510 and in contact with the sacrificial layer 516. In embodiments, the spacers 518 may be comprised of silicon oxide. The spacers 518 may be comprised of the same material as mask region 514.

FIG. 6 is a semiconductor structure 600 after a subsequent process step of removal of the sacrificial layer (compare with 516 of FIG. 5). The sacrificial layer 516 may be removed with a selective etch process, such that spacers 618 and fin hardmask 612 are not substantially removed. As a result of the removal of the sacrificial layer, a lower portion 619 of the second fin 610 is exposed. The lower portion 619 extends to the bottom of the fin at the insulator layer 604.

FIG. 7 is a semiconductor structure 700 after a subsequent process step of etching a lower portion of the second fin to form a recessed area 721. In embodiments, the recessed area 721 is formed using a partial isotropic etch of the second fin 710.

FIG. 8 is a semiconductor structure 800 after a subsequent process step of depositing a threshold voltage adjusting material 820 in the recessed area. The threshold voltage adjusting material 820 may be a capping layer or workfunction material, and may be deposited via an atomic layer deposition (ALD) process, a physical vapor deposition (PVD) process, or other suitable method. In embodiments, the threshold voltage adjusting material may be a workfunction material that may include, but is not limited to, titanium nitride, and tantalum nitride. A gate dielectric layer (not shown) may be deposited prior to depositing a workfunction material. In other embodiments, the threshold voltage adjusting material may be a capping layer that may include, but is not limited to, Al, Al2O3, Ge, GeO2, non-conducting oxides of Ti and non-conducting oxides of Ta, and may be formed by physical vapor deposition, atomic layer deposition, molecular beam epitaxy or chemical vapor deposition, or variants thereof. In embodiments, the threshold voltage adjusting material may have a thickness ranging from about 1 angstrom to about 10 angstroms. The mask region (see 714 of FIG. 7) and fin hardmask (see 712 of FIG. 7) are then removed.

FIG. 9 is a semiconductor structure 900 after a subsequent process step of gate formation. A gate 922 is formed over the first fin 908 and second fin 910. A gate dielectric layer (not shown) and additional workfunction material layers (not shown) may also be deposited prior to deposition of the gate 922, as part of industry standard gate processing. The gate 922 may be a metal gate that is formed using a replacement metal gate (RMG) process. The effective device width is a function of the area of the fins that are in contact with the gate 922. For fin 908, the effective height, which is a measure of how much of the fin is in contact with gate 922, is D1. For fin 910, the effective height is D2, which is less than D1, even though the physical height of fin 910 is similar to that of fin 908. Therefore, for fin 908, the effective device width Weff=2(D1)+W. For fin 910, the effective device width Weff=2(D2)+W, where D2<D1. Hence, fin 910 provides a smaller effective device width than fin 908. The Weff of fin 910 is a function of the height H1 of threshold voltage adjusting material regions 920. The height H1 is a function of the thickness T1 of sacrificial layer 416 (see FIG. 4). Hence, by controlling the thickness T1 of sacrificial layer 416, the effective device width Weff of fin 910 is adjustable to a fractional amount of the Weff of fin 908.

FIG. 10 is a top-down view of a semiconductor structure 1000 in accordance with embodiments of the present invention. Fin 1008 and fin 1010 are disposed on insulator layer 1004. A common gate 1022 is formed over the fins 1008 and 1010. In embodiments, a gate cut may be performed to separate the gate between fin 1008 and fin 1010. In embodiments, fin 1008 is a full Weff device, and fin 1010 is a fractional Weff device, where Weff(Fin 1010)=K*Weff(Fin 1008), where 0<K<1.

FIG. 11 is a semiconductor structure 1100 after a subsequent process step of etching a upper portion 1123 of the second fin to form a recessed area, in accordance with an alternative embodiment of the present invention. Following from semiconductor structure 400 of FIG. 4, instead of forming spacers as with the previously described embodiment, the upper portion 1123 of the second fin 1110 is etched. The fin hardmask for fin 1110 (compare with 412 of FIG. 4) may also be removed. In embodiments, the thickness T1 of sacrificial layer 1116 may range from about 0.1 to about 0.5 of total fin height D1.

FIG. 12 is a semiconductor structure 1200 after a subsequent process step of depositing a workfunction material 1220 in the recessed area. The workfunction material 1220 may be deposited via an atomic layer deposition (ALD) process. In embodiments, the workfunction material may include, but is not limited to, titanium nitride, and tantalum nitride. As a result of the deposition of the workfunction material 1220 in the upper portion and on the top of fin 1210, the Weff of fin 1210 is 2(D4), where D4 is the effective height of fin 1210, while the Weff of fin 1208 is 2(D3)+W, where D3 is the effective (and actual) height of fin 1208 and W is the width of fin 1208. Hence, the fin width does not contribute to the Weff of fin 1210.

FIG. 13 is a semiconductor structure 1300 after a subsequent process step of gate formation. A gate 1322 is formed over the first fin 1308 and second fin 1310. A gate dielectric layer (not shown) and additional workfunction material layers (not shown) may also be deposited prior to deposition of the gate 1322, as part of industry standard gate processing. The gate 1322 may be a metal gate that is formed using a replacement metal gate (RMG) process. The effective device width is a function of the area of the fins that are in contact with the gate 1322. For fin 1308, the effective device width Weff=2(D3)+W. For fin 1310, the effective device width Weff=2(D4), where D4<D3. Hence, fin 1310 provides a smaller effective device width than fin 1308. The Weff of fin 1310 is a function of the height D4 of the exposed fin surface. The height D4 is a function of the thickness T1 of sacrificial layer 1116 (see FIG. 11). Hence, by controlling the thickness T1 of sacrificial layer 1116, the effective device width Weff of fin 1310 is adjustable to a fractional amount of the Weff of fin 1308.

FIG. 14 is a flowchart 1400 indicating process steps for embodiments of the present invention. In process step 1450, first and second fins are formed (see 208 and 210 of FIG. 2). In process step 1452, the first fin is masked (see 314 of FIG. 3). In process step 1454, a sacrificial layer is deposited (see 416 of FIG. 4). In process step 1456, spacers are formed (see 518 of FIG. 5). In process step 1458, a portion of the second fin is etched (see 721 of FIG. 7). In process step 1460, a threshold voltage adjusting material is deposited on the second fin (see 820 of FIG. 8). In embodiments, the threshold voltage adjusting material may be a workfunction adjusting material and/or a capping layer. In process step 1462, spacers and mask regions are removed (see 800 of FIG. 8). In process step 1464, a gate is formed (see 922 of FIG. 9). From this point forward, industry-standard techniques may be used to complete the fabrication of the integrated circuit (IC). These steps may include back-end-of-line (BEOL) formation, which includes metallization and via layers, followed by packaging and test.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method of forming a semiconductor structure, comprising:
   forming a first fin and a second fin on an insulator layer, wherein the insulator layer is disposed on a semiconductor substrate;
   forming a mask region over the first fin;
   depositing a sacrificial layer adjacent to the second fin;
   forming a plurality of spacers adjacent to the second fin and in contact with the sacrificial layer;
   etching a lower portion of the second fin to form a recessed area, the lower portion being adjacent to and above the insulator layer;
   depositing a threshold voltage adjusting material in the recessed area, thereby modulating effective device width;
   removing the plurality of spacers and mask region, and making an outermost side surface of the threshold voltage adjusting material flush and coplanar with an outermost side surface of the fin; and
   forming a gate, the gate disposed over the first fin and the second fin.

2. The method of claim 1, wherein forming a mask region over the first fin comprises forming a silicon oxide region.

3. The method of claim 2, wherein forming a plurality of spacers comprises forming silicon oxide spacers.

4. The method of claim 3, wherein the sacrificial layer is comprised of silicon nitride.

5. The method of claim 4, wherein etching a lower portion of the second fin is performed with an isotropic etch process.

6. The method of claim 1, wherein depositing a threshold voltage adjusting material comprises depositing a threshold voltage adjusting material using a physical vapor deposition process.

7. The method of claim 1, wherein depositing a threshold voltage adjusting material comprises depositing titanium nitride.

8. The method of claim 1, wherein depositing a threshold voltage adjusting material comprises depositing tantalum nitride.

9. The method of claim 1, wherein the recessed area is a feature differentiating the second fin from the first fin.

10. The method of claim 1, wherein the gate is disposed over first fin and the second fin including over the threshold voltage adjusting material in the recessed area of the second fin.

11. The method of claim 1, wherein depositing a threshold voltage adjusting material comprises depositing a metal nitride.

12. A method of forming a semiconductor structure, comprising:
forming a first fin and a second fin on an insulator layer, wherein the insulator layer is disposed on a semiconductor substrate;
forming a mask region over the first fin;
depositing a sacrificial layer adjacent to the second fin;
etching an upper portion of the second fin to form a recessed area;
depositing a threshold voltage adjusting material in the recessed area, such that an outermost side surface of the threshold voltage adjusting material is flush and coplanar with an outermost side surface of the fin, thereby modulating effective device width;
removing the mask region; and
forming a gate, the gate disposed over the first fin and the second fin at a range of elevations above and below a bottom elevation of the threshold voltage adjusting material.

13. The method of claim 12, wherein forming a mask region over the first fin comprises forming a silicon oxide region.

14. The method of claim 13, wherein the sacrificial layer is comprised of silicon nitride.

15. The method of claim 12, wherein depositing a threshold voltage adjusting material comprises depositing titanium nitride.

16. The method of claim 12, wherein depositing a threshold voltage adjusting material comprises depositing tantalum nitride.

17. A semiconductor structure comprising:
a semiconductor substrate;
an insulator layer disposed on the semiconductor substrate;
a first semiconductor fin disposed on the insulator layer;
a second semiconductor fin disposed on the insulator layer;
wherein the first semiconductor fin has a first effective height and the second semiconductor fin has a second effective height, and wherein the first effective height is greater than the second effective height; and
a threshold voltage adjusting material disposed on a portion of the second semiconductor fin such that an outermost side surface of the threshold voltage adjusting material is flush and coplanar with an outermost side surface of the second semiconductor fin.

18. The semiconductor structure of claim 17, wherein the threshold voltage adjusting material is disposed on a lower portion of the second semiconductor fin.

19. The semiconductor structure of claim 17, wherein the threshold voltage adjusting material is disposed on an upper portion of the second semiconductor fin.

20. The semiconductor structure of claim 17, wherein the threshold voltage adjusting material is a workfunction material selected from the group consisting of titanium nitride and tantalum nitride.

* * * * *